United States Patent [19]

Kessler, Jr.

[11] 4,258,383

[45] Mar. 24, 1981

[54] MINIMUM PRESSURE DROP LIQUID COOLED STRUCTURE FOR A SEMICONDUCTOR DEVICE

[75] Inventor: Sebastian W. Kessler, Jr., Lancaster, Pa.

[73] Assignee: RCA Corporation, New York, N.Y.

[21] Appl. No.: 972,406

[22] Filed: Dec. 22, 1978

[51] Int. Cl.³ .................... H01L 25/04; H01L 23/48
[52] U.S. Cl. ................................ 357/82; 165/105; 357/68
[58] Field of Search ................. 357/80, 81, 82, 68; 174/16 HS; 165/105

[56] References Cited

U.S. PATENT DOCUMENTS

| | | | |
|---|---|---|---|
| 2,815,473 | 12/1957 | Ketteringham | 357/82 |
| 3,654,528 | 4/1972 | Barkan | 357/82 |
| 3,800,190 | 3/1974 | Marek | 357/82 |
| 3,812,404 | 5/1974 | Barkan | 357/82 |
| 3,986,550 | 10/1976 | Mitsuoka | 357/82 |
| 4,138,692 | 2/1979 | Meeker et al. | 357/82 |

FOREIGN PATENT DOCUMENTS 914034  12/1962  United Kingdom ............ 357/8

OTHER PUBLICATIONS

IBM Technical Disclosure Bulletin, vol. 18, No. 11, Apr. 1976, Low-Cost Cooling Package, by Nuccio, pp. 3761-3762.

IBM Technical Disclosure Bulletin, vol. 20, No. 10, Mar. 1978, Device Cooling by Johnson, pp. 3919-3920.

Primary Examiner—Andrew J. James
Attorney, Agent, or Firm—Eugene M. Whitacre; Dennis H. Irlbeck; Vincent J. Coughlin, Jr.

[57] ABSTRACT

The device includes a semiconductor wafer that is cooled on one side, and preferably on both sides, by a liquid cooling system. The system preferably comprises a cylindrical cooling chamber including a relatively thin thermally conductive base wall bonded directly to the wafer for good thermal contact. Liquid coolant is supplied to the base wall, which in turn cools the wafer, through a conduit terminating in a circular flange disposed within the chamber in close proximity to the base wall. The coolant is forced between the flange and base wall and is directed substantially over the entire base wall surface by the flange. The surface of the flange facing the base wall is formed to have a frustro-conical surface to reduce the pressure of the coolant as it flows constrictedly between the flange and base wall as well as to enhance the uniformity of heat transfer across the base wall and thus from the wafer.

2 Claims, 3 Drawing Figures

4,258,383

MINIMUM PRESSURE DROP LIQUID COOLED STRUCTURE FOR A SEMICONDUCTOR DEVICE

BACKGROUND OF THE INVENTION

1. Field of the Invention

This invention relates to a semiconductor transcalent device and, more particularly, to a transcalent device that is cooled by a circulating liquid.

2. Description of the Prior Art

The term transcalent device is used to describe a family of high power solid state devices that include integral cooling systems. These devices are constructed to minimize the thermal resistance between a semiconductor wafer, such as silicon or germanium which is the active part of the device, and the ultimate heat sink. Such semiconductor devices include, for example, thyristors, silicon-controlled rectifiers (SCR) and transistors. All these devices produce relatively large amounts of heat, which must be effectively dissipated to prevent breakdown or destruction of the device. Different types of heat sinks have been used. One type utilizes a heat pipe structure affixed to the semiconductor wafer. In another type, to which this invention relates, liquid is circulated in close proximity to the wafer to dissipate the heat.

In a liquid cooled transcalent device using water, for example, a heated surface can typically be cooled to a temperature lower than that possible with heat pipes utilizing water as the working fluid dissipating the same amount of power. This makes liquid cooled devices very well suited for uses in applications where the devices must conduct large surges of power at a relatively small duty factor.

As is known in the art, the higher the velocity of the circulating liquid coolant, the greater the amount of heat transfer. One of the problems in attempting to achieve maximum liquid velocity is the resultant pressure losses induced. Typically, design constraints of the device are such that flow paths are not ideal and pressure losses are produced as the liquid flows through the device. The greater the pressure buildup, the more power that is needed to pump the liquid through the cooling system. In applications where pumping power is limited, cooling the device is a task of balancing the greatest velocity with the minimum pressure drop.

In addition to pressure loss problems, the uniformity of the heat transfer across the heat transfer surface is also to be considered. It is evident that the operation of a transcalent device is limited by the highest heat flux which can be dissipated at the region of lowest heat transfer or liquid velocity. A cooling system wherein the liquid velocity over the heated surface produces substantially uniform heat transfer is therefore desirable.

SUMMARY OF THE INVENTION

A novel device comprises a semiconductor wafer and means for cooling the wafer at least on one side by a liquid coolant. The cooling means is designed to reduce the pressure of the coolant as it flows between the flange portion and the base wall of the cooling structure as well as to enhance the uniformity of heat transfer across the base wall and thus from the semiconductor wafer.

DETAILED DESCRIPTION OF THE PREFERRED EMBODIMENT

Figure 1:
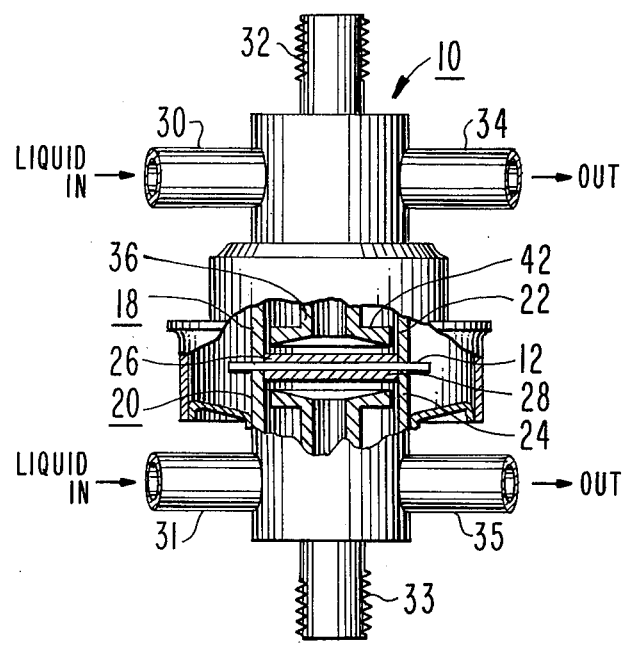
FIG. 1 is an elevation view, partly in section of a semiconductor transcalent device incorporating a novel liquid cooling arrangement.

There is shown in FIG. 1 of the drawing, a transcalent semiconductor thyristor 10 cooled by two novel liquid cooling systems capable of producing substantially uniform heat transfer and operating at relatively low pumping pressures. The semiconductor thyristor may be of the type described in detail in U.S. Pat. No. 3,739,235, issued to Sebastian William Kessler, Jr., on June 12, 1973 which is herein incorporated by reference. Such a thyristor comprises a semiconductor wafer 12 which is formed of layers of doped semiconductor material providing an NPNP device. Shown in detail in FIG. 2, the wafer 12 has a conductive cathode electrode coating 14 on one major surface of the wafer 12 and a conductive anode electrode coating 16 on the opposite surface. The cooling chambers 18 and 20 shown in FIG. 1, for liquid cooling the wafer 12 on both sides, are attached to electrodes 14 and 16, respectively. Although not shown, the configuration of the wafer 12 is that of a substantially round disc. Even though the specific device shown is that of a thyristor, the liquid cooling structure and packaging arrangements described herein are similarly applicable to other semiconductor devices, such as transistors and rectifiers. For this reason, the wiring connections to the wafer 12 are not shown, since depending upon the type of device desired, the wiring will vary. In all of these devices, a high current lead is attached to the device at the studs 32 and 33 situated at each end of the package, respectively.

To assure good thermal contact, the two cooling chambers 18 and 20 are preferably bonded directly to the opposite major surfaces of the wafer 12. However, the chambers 18 and 20 may also be clamped to achieve good thermal contact as described in U.S. Pat. No. 4,126,879, issued to Kessler, Jr. on Nov. 21, 1978. The chambers include two closed cylinders 22 and 24, respectively, each cylinder being formed preferably of copper for its good heat transfer and resistance to corrosion properties as well as for conducting high currents to the wafer 12 with minimum voltage drop. Circular metal base walls, 26 and 28, are respectively brazed across one open end of each cylinder 22 and 24. The base walls 26 and 28 are of a highly thermally conductive material, such as molybdenum, and are formed relatively thin, on the order of about 0.030 inches (0.762 mm), to minimize the thermal resistance through the walls to the wafer 12. The cylinders 22 and 24 are conductively bonded as by brazing to the respective electrode coatings 14 and 16. Also, all the matching surface areas of the corresponding base walls 26 and 28 are brazed or soldered to the electrode coatings 14 and 16 respectively of the wafer 12 to provide good thermal contact as well as electrical contact between these parts.

A suitable liquid coolant, such as water, is supplied to both sides of the wafer 12 through inlet ports 30 and 31 respectively. The liquid coolant is pumped from an external source (not shown) to circulate within the chambers 18 and 20 and subsequently exit through outlet ports 34 and 35, respectively. Where, for example, the outlet port 34 is connected to feed the inlet port 31, the coolant should be dielectric, preferably having an electrical resistivity greater than one megohm. This liquid may be deionized water or a silicate ester such as Coolanol 25 (tradename), available from Monsanto Industrial Chemical Company, New York, N.Y. Such coolants may also be used when the device inlet ports 30 and 31 are independently connected to an external coolant supply. A more detailed description of the internal coolant circulation is made with reference to FIG. 2.

Figure 2:
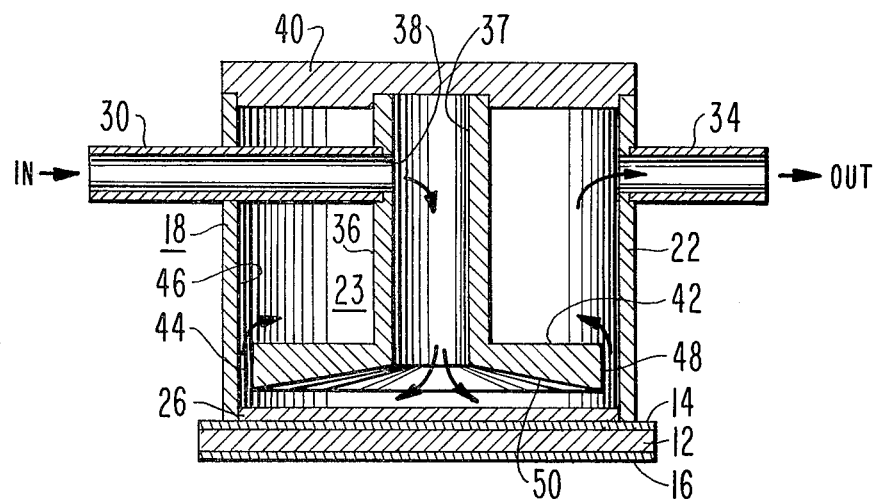
FIG. 2 is an enlarged sectional view of one of the liquid cooling structures of the device of FIG. 1.

Chamber 18 is illustrated in detail in FIG. 2. Although, not shown, chamber 20 is similarly constructed. The inlet port 30 is sealed through the cylinder 22, extending within the interior 23 of the chamber 18 to a conduit 36, preferably formed of cylindrical tubing, to which the port 30 is attached. The conduit 36 is preferably oriented substantially along the center axis of the cylinder 22. An orifice 38 is provided at the junction of the port 30 and the conduit 36 to allow the coolant to pass into the interior of the conduit 36. The chamber 18 is closed by a substantially circular metal plate 40 which is brazed to cylinder 22. The conduit 36 is affixed to the plate 40 for mechanical support and terminates within chamber 18 with a flange portion 42. The flange 42 is substantially round, extending nearly across the surface of the base wall 26, so that only a small gap 44, on the order of 0.020 inches (0.508 mm) exists between the inner cylindrical wall 46 of cylinder 22 and the periphery 48 of the flange 42. The flange 42 is disposed in the chamber 18 to a relatively close proximity to the base wall 26, typically on the order of 0.020 inches (0.508 mm).

The liquid coolant that is supplied to the inlet port 30 flows through the inner diameter 37 of the conduit 36 to the thermally conductive base wall 26. The coolant is then forced between the flange 42 and the base wall 26, the flange directing the coolant substantially across the entire surface of the base wall 26. The coolant emerges through the gap 44 into the interior 23 of the chamber 18, where it then flows into the outlet port 34. This sequence is illustrated by the arrows in FIG. 2.

In accordance with the present cooling arrangement, the flange surface 50 facing the base wall 26 is made frustro-conical, wherein the smaller diameter of the frustro-conical surface 50 coincides with the inner diameter 37 of the conduit 36. It is preferable, that the larger diameter of the surface 50 substantially coincide with the periphery 48 of the flange 42. The conical surface 50 is provided to establish and maintain a substantially uniform fluid pressure over the entire surface of the base wall 26, and thereby enhance the uniformity of heat transfer across the surface of the wall 26 and thus from the wafer 12 as will be explained in detail.

In the known prior art liquid cooling devices, a structure similar to the present system is used, except the conduit for supplying liquid to the base wall terminates in a flange that is substantially parallel to the surface of the base wall. As the liquid enters the constriction between the parallel flange and base wall of this prior art structure, the liquid velocity immediately increases and then gradually decreases as it flows radially from the center of the conduit to the periphery of the flange. This change in velocity is largely due to an ever-increasing cross-sectional area for the radially flowing volume of liquid. Such a change in velocity undesirably produces a significant pressure drop and a decreasing heat transfer coefficient as the fluid flows outwardly under the flange.

Figure 3:
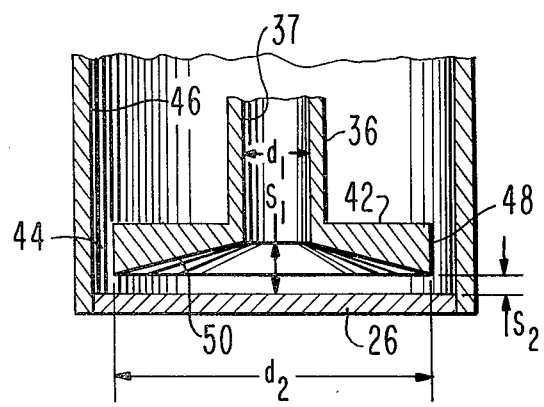
FIG. 3 is an enlarged sectional view of a portion of the liquid cooling arrangement shown in FIG. 2.

The frustro-conical surface 50 of the present cooling arrangement, shown in detail in FIG. 3, provides improved fluid flow and cooling conditions over these prior art devices. Regarding the pressure drop, the frustro-conical surface 50 serves two purposes: first, it smooths the transition of the fluid flowing from the conduit 36 to the constricted area between the flange 42 and the base wall 26, and second, it controls the pressure losses of the liquid as it flows beneath the flange 42 from its inner diameter $d_1$ to its outer diameter $d_2$.

The pressure drop of a liquid flowing through a tube or channel can be expressed by the well known equation $$P_2 - P_1 = K \frac{(V_2 - V_1)^2}{2g} \quad (1)$$

where K is the loss coefficient of the fluid as it flows through the tube, g is the gravitational constant and $V_1$ and $V_2$ are the velocities at the entrance and exit of the tube or channel, respectively. The liquid coolant forced between the conical surface 50 and the base wall 26 can be considered as a fluid flowing through a tube or channel. The pressure drop of the liquid flowing radially outward from $d_1$ to $d_2$ may be minimized, in a preferred form of the present cooling arrangement, when the velocities of the coolant at the entrance and exit are equal. This can be achieved by forming the frustro-conical surfaces 50 so that the flow area at $d_1$ is equal to the flow area at $d_2$. These entrance and exit areas are equal when the following equation is satisfied:

$$d_2/d_1 = s_1/s_2 \quad (2)$$

where $s_1$ is the spacing between surface 50 and the base wall 26 at diameter $d_1$ of the conduit 36 and $s_2$ is the spacing between the surface 50 and the base wall 26 at diameter $d_2$ at the periphery 48 of the flange 42.

The heat transfer coefficient, $h_o$, of a liquid flowing turbulently through a tube or channel, according to Frank Kreith, *Principles of Heat Transfer*, second edition, International Textbook Co., 1965, pages 379–386, can be expressed as follows:

$$\frac{h_o D_e}{k} = .023 \left( \frac{V \rho D_e}{\mu} \right)^{.8} \left( \frac{C_p \mu}{k} \right)^{.3} \quad (3)$$

where
  $D_e$ = equivalent diameter of the tube
  k = thermal conductivity of the liquid
  $\mu$ = liquid viscosity
  $C_p$ = specific heat of the liquid
  V = velocity of the liquid
  $\rho$ = liquid density
It can be shown by using equation 3, that while the velocities of the fluid entering and exiting the area beneath the flange 42 are equal for minimum pressure losses, the heat transfer coefficient across this surface will not be uniform, but nearly so. By assuming little, if any, changes in the properties of the liquid flowing beneath flange 42 at relatively high velocities, a ratio of heat transfer coefficients at entrance and exit can be reduced to a function of the velocities and diameters at entrance and exit. Where the velocities, $V_1$ and $V_2$ are equal, i.e., at the condition of minimum pressure drop as hereinbefore described, the ratio of heat transfer coefficients can be expressed as $$\frac{h_{o2}}{h_{o1}} = \left(\frac{d_1}{d_2}\right)^{.2}$$

This means that where the diameter $d_2$ of the flange 42 is about three times as large as the diameter $d_1$ of the conduit 36, the heat transfer coefficient at $d_2$ is calculated to be approximately 80% of that at $d_1$; or if $d_2$ is six times larger than $d_1$, the heat transfer coefficient at $d_2$ will be about 70% of that at $d_2$. By comparison, the heat transfer coefficient at the periphery of a parallel-type prior art flange is calculated to be about 33% of the coefficient at the entrance where the flange diameter is three times the conduit diameter, and only about 16% where the diameter ratio is six to one. Thus, for a minimum pressure cooling system, the flange having the frustro-conical surface, represents a considerable improvement in heat transfer uniformity over the prior art systems.

Where an absolute minimum pressure is not required, the frustro-conical surface 50 may be formed, in another preferred arrangement of the present cooling system, so that the heat transfer coefficient will be substantially constant as the fluid flows between the surface 50 and the base wall 26. If the heat transfer coefficients at the entrance $d_1$ and exit $d_2$ are equated, the following ratio can be derived by using equation 3 above:

$$\frac{d_2}{d_1} = \left(\frac{s_1}{s_2}\right)^{.8} \qquad (4)$$

The selection of diameters $d_1$ and $d_2$ and spacings $s_1$ and $s_2$ that satisfy equation 4 will result in a frustro-conical surface 50 that will produce a substantially uniform heat transfer coefficient across the surface of the base wall 26 beneath the flange 42. At this condition, the entrance and exit flow areas, and thus, the velocities, are not equal. Therefore, the pressure drop from entrance to exit will not be a minimum. As an example, if the inner diameter $d_1$ of the conduit 36 is 0.270 inches (6.86 mm) and the outer diameter $d_2$ of the flange 42 is 0.825 inches (20.96 mm), and the spacing $s_2$ is 0.020 inches (0.508 mm), then the spacing $s_1$ would have to be 0.081 inches (2.06 mm) to satisfy equation 4 for uniformity of heat transfer coefficients. At this condition, even though the velocities differ, the ratio of the velocities can be found to be equal to about 1.3. For example, at a liquid flow rate of about four gallons/min. (2.85 liters/min.), the velocity $V_1$ at the diameter $d_1$ would be about 107 cm./sec. and the velocity $V_2$ at $d_2$ would be about 137 cm./sec. The thermal resistance between the wafer 12 and the cooling liquid at these flow conditions is typically on the order of about 0.1° C./watt.

The pressure drop of this type system, using Coolanol 25 at $-37°$ C. as the coolant, was calculated to be about 1.8 psi. ($12.4 \times 10^3$ newton/sq. m). In comparison, the ratio of the velocities of the prior art parallel flange having the same diameters as the frustro-conical flange 42 but having a constant spacing of 0.020 inches (0.508 mm) would be about 3.0. The pressure drop of this prior art system also using Coolanol 25 at $-37°$ C. was calculated to be about 2.5 psi. ($17.2 \times 10^3$ newton/sq. m). It can be seen that the frustro-conical surface 50, formed to provide a uniform heat transfer across the base wall 26, will also produce a lower pressure drop than that of the prior art parallel flange.

Although the present cooling system has been described to preferably provide either minimum pressure conditions or substantially uniform heat transfer, it should be understood that the frustro-conical surface 50, may also be formed to provide conditions between these extremes, depending upon the pressure limitations and cooling requirements of the liquid cooling system desired.

Even though the semiconductor device has been herein described to have liquid cooling chambers 18 and 20 on both sides of the wafer 12, cooling may also be effected by using a cooling chamber on only one side of the wafer 12. It will also be appreciated that while the liquid cooling structure is preferably of the radial flow type having substantially circular components, other shape chambers, conduits and flanges may also be used. For example, a conduit having a substantially square cross-section may be terminated by a square flange within a square chamber. The surface of the flange facing the base wall of the container may be formed to have a truncated pyramidal surface. Similar to the frustro-conical surface, each of the pyramidal surfaces would slope obliquely toward the surface of the base wall from the center of the conduit in an outward direction toward the periphery of the flange. What is claimed is:

1. A semiconductor device of the type comprising a semiconductor wafer, at least one substantially circular cooling chamber for cooling one side of the semiconductor wafer by a liquid coolant, said cooling chamber including a relatively thin thermally conductive base wall in thermal contact with said semiconductor wafer, means to supply said liquid coolant to said base wall including a tube having an inner diameter, $d_1$, said tube terminating in a substantially circular flange portion having a frustro-conical surface for directing the coolant substantially radially outwardly across the entire base wall surface, said frustro-conical surface having a smaller diameter coincident with the inner diameter, $d_1$, of said tube and a larger diameter, $d_2$, substantially coincident with the periphery of said flange portion, said flange portion being disposed within said chamber in relatively close proximity to said base wall so that the spacing, $s_1$, between the base wall and the frustro-conical surface of said flange at the tube inner diameter, $d_1$, and the spacing, $s_2$, between the base wall and the frustro-conical surface of said flange at the diameter, $d_2$, conform substantially with the expression $$d_2/d_1 = s_1/s_2$$

thereby providing the minimum pressure drop in said liquid coolant.

2. The device as in claim 1, wherein the velocity of said liquid coolant entering the spacing, $s_1$, from said tube is equal to the velocity of said liquid coolant exiting the spacing, $s_2$, at the periphery of said flange.

* * * * *